United States Patent [19]

Leupold

[11] Patent Number: 4,647,887
[45] Date of Patent: Mar. 3, 1987

[54] LIGHTWEIGHT CLADDING FOR MAGNETIC CIRCUITS

[75] Inventor: Herbert A. Leupold, Eatontown, N.J.

[73] Assignee: The United States of America as represented by the Secretary of the Army, Washington, D.C.

[21] Appl. No.: 685,426

[22] Filed: Dec. 24, 1984

[51] Int. Cl.⁴ .............................................. H01F 3/12
[52] U.S. Cl. .................................. 335/211; 335/304; 335/306
[58] Field of Search ............... 335/302, 303, 304, 306, 335/210, 211, 214

[56] References Cited

U.S. PATENT DOCUMENTS

| | | | |
|---|---|---|---|
| 2,799,813 | 7/1957 | Rademakers et al. | 335/210 |
| 2,895,092 | 7/1959 | Cluwen | 335/304 |
| 3,205,415 | 9/1965 | Seki et al. | 335/210 |
| 3,227,931 | 1/1966 | Adler | 335/304 |
| 3,237,059 | 2/1966 | Meyerer | 335/306 X |

Primary Examiner—George Harris
Attorney, Agent, or Firm—Sheldon Kanars; Jeremiah G. Murray; Paul A. Fattibene

[57] ABSTRACT

A magnetic cladding device having a constant exterior magnetic potential equal to a magnetic potential at a point between either end of an active magnet for enhancing the active magnet's field and reducing magnetic field leakage comprising a magnetic cladding circumscribing an active magnet and having a magnetic axis transverse to that of the active magnet.

9 Claims, 5 Drawing Figures

LIGHTWEIGHT CLADDING FOR MAGNETIC CIRCUITS

The invention described herein may be manufactured, used, and licensed by or for the Government for Governmental purposes without the payment to me of any royalties thereon.

BACKGROUND OF THE INVENTION

1. Field of the Invention

This invention relates generally to the field of magnetic circuits for electronic devices, and more specifically to a magnetic circuit including a structure for magnetically cladding the circuit to eliminate undesirable exterior magnetic fields.

2. Description of Prior Art

Various magnetic devices requiring a controlled magnetic field, such as klystrons, traveling wave tubes, microwave devices, and other magnetic circuits, have employed magnetic cladding to help intensify the desired controlled magnetic field as well as to reduce the external effects of the magnetic circuit on the surrounding environment due to magnetic field leakage.

Those concerned with the development of magnetic cladding devices have long recognized the need for improving the magnetic intensity per unit weight of magnetic circuits, thereby improving the overall size and cost of such devices. For example, Neugebauer U.S. Pat. No. 3,768,054, entitled "Low Flux Leakage Magnetic Construction" discloses a number of magnetic circuits each having a magnetic cladding means mounted thereon. These various prior-art cladding devices produce cladded circuits that reduce the exterior flux leakage and increase the desired controlled magnetic field intensity without appreciably increasing the size or weight of the magnetic circuit. More specifically, in the Neugebauer patent, the magnetic flux of a first magnet is conserved by placing a second permanent magnet adjacent the first magnet with the magnetic axis of the second magnet perpendicular to the axis of the first magnet to prevent leakage of flux from the first magnet. As a result, most of the flux generated by the first magnet in directions skewed from the main axis is redirected to increase the magnetic intensity along the main axis. Although prior-art devices such as Neugebauer's have served the purpose, they have not gone far enough in maximizing size and weight reduction.

SUMMARY OF THE INVENTION

In general, the invention comprehends a magnetic structure which comprises, in combination, a longitudinally extending first magnet having a longitudinal magnetic polarity, a second magnet surrounding a substantial portion of the length of said first magnet, and having a generally radial magnetic polarity transverse to the longitudinal magnetic polarity of said first magnet, said second magnet having a constant magnetic potential on its outer exterior surface equal to the magnetic potential on the outer surface of said first magnet at a circumferential portion between the ends thereof.

In the present invention, the combination of the specific geometric configurations of the magnetic cladding structure and the specific orientations of the polarity of the cladding structure with respect to the magnetic circuit effect a considerable reduction in the size, weight and cost over that achievable with prior-art structures. The magnetic cladding in the present invention is improved by taking advantage of the magnetic materials' ability to be polarized in opposite directions, and by providing specific geometric configurations that result in a constant magnetic potential on the exterior surface equal to the magnetic potential at a point other than at an end of the magnetic circuit to be cladded.

It is therefore an object of this invention to provide an improved magnet construction wherein the leakage flux is minimized.

It is another object of the invention to provide a magnet construction having an improved magnetic intensity per unit weight ratio.

The exact nature of this invention as well as other objects and advantages thereof will be readily apparent from consideration of the following specification relating to the annexed drawings in which:

DETAILED DESCRIPTION OF THE DRAWINGS

Figure 1:
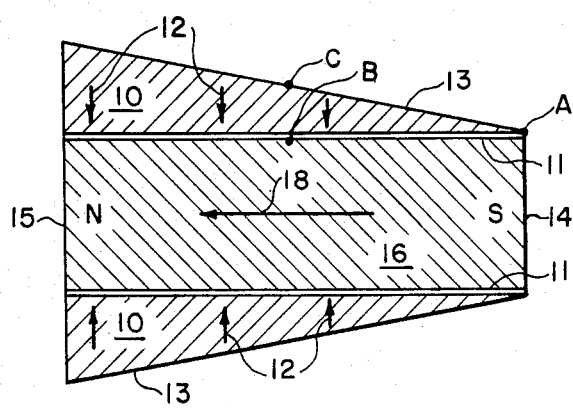
FIG. 1 is a longitudinal cross-section of a prior-art device cut along the line 1—1 in FIG. 2 and looking in the direction of the arrows.
Figure 2:
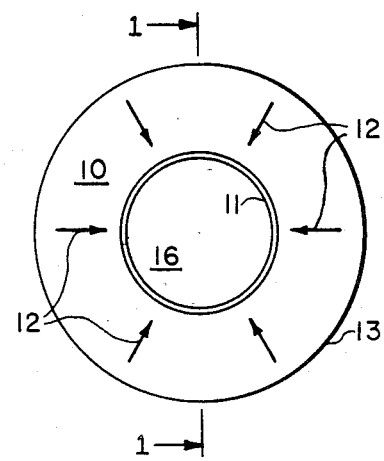
FIG. 2 is an end view of the prior-art device shown in FIG. 1.

FIGS. 1 and 2 show a prior art device of the type disclosed in U.S. Pat. No. 3,768,054 entitled "Low Flux Leakage Magnet Construction". Magnet 16 is a uniformly magnetized solid cylindrical magnet having a polarity in the direction indicated by arrow 18. Arrow 18 points in the direction of the north pole N of magnet 16. Magnet 16 is circumscribed by a coaxially mounted longitudinally extending uniformly magnetized cladding magnet 10. Cladding magnet 10 is of truncated conical shape. The smaller outside diameter or truncated end of magnet 10 is adjacent end 14 of magnet 16. The larger outside diameter or base of magnet 10 is adjacent end 15 of magnet 16. Cladding magnet 10 has a radial polarity in a direction represented by arrows 12. Arrows 12 point in the direction of the north pole of magnet 10, and are normal to the direction of the polarity of magnet 16.

The magnetic potential along the exterior surface 11 of magnet 16 increases linearly from end 14 to the other end 15. As a result, magnet 16 is of lower magnetic potential at end 14 than at end 15. End 14 may be considered to be a magnetic reference point of zero magnetic potential. A point between the ends of magnet 16 where the magnetic potential difference from that point to either end of magnet 16 is equal and opposite is defined as the magnetic midpoint. The increase in magnetic potential from end 14 to end 15 along exterior surface 11 is linear because magnet 16 is uniformly magnetized. The radial magnetic potential difference of magnet 10 is zero at end 14 and a maximum at end 15. This is because the radial thickness of magnet 10 is zero at end 14 and a maximum at end 15. As shown in FIG. 1, the radial thickness of magnet 10 increases linearly from end 14 to end 15. Consequently, the radial potential difference across the thickness of magnet 10 increases linearly between ends 14 and 15. The radial thickness of magnet 10 is chosen such that both the radial potential difference across the radial thickness of magnet 10 and the linear potential difference along the outer surface 11 of magnet 16 increase at the same rate from end 14 to end 15.

The magnetic potential difference along surface 11 of magnet 16 from end 14 at point A to any point B on surface 11 is equal and opposite to the potential difference from the point B to a point C on surface 13 of magnet 10. Where point C is the point that intersects surface 13 when a perpendicular is extended radially outward from point B. This will be true for any point B on surface 11. As a result of these equal and opposite magnetic potential differences the magnetic potential that exist on surface 13 of magnet 10 will be a constant equal to the magnetic potential at end 14, which has been made a reference point having a zero magnetic potential. This constant magnetic potential along the exterior of magnet 10 results in the elimination of magnetic flux leakage.

Figure 3:
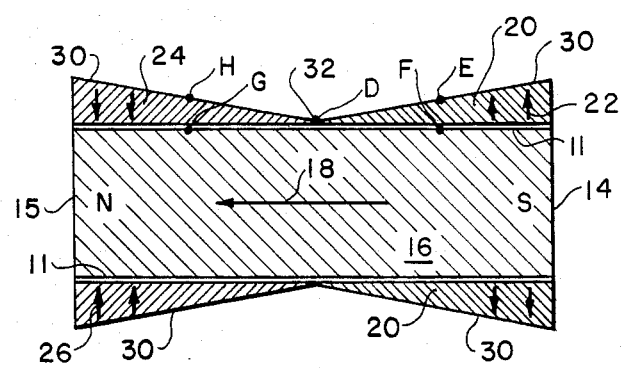
FIG. 3 is a longitudinal cross-section of a first embodiment of the invention similar to the view shown in FIG. 1.

Cylindrical magnet 16 of FIG. 3 is of the prior art type shown in FIGS. 1 and 2. Magnet 16 is a uniformly magnetized solid cylindrical magnet having a polarity in the direction indicated by arrow 18. The magnetic potential of magnet 16 along surface 11 increases uniformly from end 14 to end 15. The magnetic potential of magnet 16 will be a minimum at end 14, and a maximum at end 15. As a reference the magnetic potential at end 14 on magnet 16 is taken as zero. Magnet 16 is circumscribed by coaxially mounted uniformly magnetized magnets 20 and 24. Cladding magnets 20 and 24 are of truncated conical shape. The smaller outside diameters or truncated ends of magnets 20 and 24 are adjacent each other and positioned over intermediate circumferential portion or locus 32. The larger outside diameter or base portion of magnet 20 is positioned adjacent end 14. The larger outside diameter or base portion of magnet 24 is positioned adjacent end 15. Magnet 20 has a radially extending magnetic polarity in a direction indicated by arrows 22. Arrows 22 point toward the north pole of magnet 20, and radially away from magnet 16. Magnet 24 has a radially extending magnetic polarity in a direction indicated by arrows 26. Arrows 26 point toward the north pole of magnet 24, and radially toward magnet 16. The radial magnetic potential of magnet 20 is of opposite polarity to that of the radial magnetic potential of magnet 24. Magnet 20 has a radial polarity between the surfaces 11 and 30 that will add to, or complement the increasing magnetic potential of magnet 16 from end 14 to intermediate circumferential portion or locus 32. Magnet 24 has a radial polarity between the surfaces 11 and 30 that will subtract from or counter the increasing magnetic potential of magnet 16 from intermediate portion 32 to end 15.

The radial magnetic potential difference of magnet 20 between surfaces 11 and 30 increases with increasing radial thickness. Magnet 20 will therefore have a maximum radial magnetic potential difference at end 14, at its maximum radial thickness, and a zero radial magnetic potential difference at intermediate circumferencial portion or locus 32, at its zero radial thickness. The radial magnetic potential difference of magnet 24 between surfaces 11 and 30 also increases with radial thickness. Therefore magnet 24 will have a maximum radial magnetic potential difference at end 15, at its maximum radial thickness, and a zero radial magnetic potential difference at intermediate circumference portion or locus 32, at its zero radial thickness.

The radial thickness of magnet 20 is chosen to vary, while progressing in the axial direction, at the same rate that magnet 16 increases in potential from end 14 to intermediate circumferential portion or locus 32. The radial thickness of magnet 20 will therefore vary linearly along its longitudinal extent because the axial magnetic potential of magnet 16 varies linearly along its longitudinal extent. The radial thickness of magnet 20 is also chosen so that the radial magnetic potential rise between the surfaces 11 and 30 at end 14 is equal to the magnetic potential drop between intermediate circumferential portion or locus 32 and end 14. This will result in the potential between the surfaces 30 and 11 at end 14 being equal and opposite to the magnetic potential between end 14 and intermediate circumferential portion or locus 32. A similar analysis can be applied to any point on surface 11 between intermediate circumferential portion or locus 32 and end 14. The magnetic potential drop between point D at intermediate circumferential portion or locus 32 and any point F on surface 11 extending in a direction toward end 14 will be equal to the radial magnetic potential rise between point F and point E, where point E is the point at which a perpendicular on surface 11 extending radially at point F intersects surface 30. This will result in a constant magnetic potential along surface 30 on magnet 20 equal to the magnetic potential existing at intermediate circumferential portion or locus 32.

A similar analysis can be used for the other end of magnet 16 circumscribed by magnet 24. The radial thickness of magnet 24 is also chosen to vary along its longitudinal extent at the same rate that magnet 16 increases in potential from intermediate circumferential portion or locus 32 to end 15. The radial thickness of magnet 24 will therefore vary linearly in the axial direction because the axial magnetic potential of magnet 16 varies linearly. The radial thickness of magnet 24 will therefore vary linearly in the axial direction because the axial magnetic potential of magnet 16 varies linearly. The radial thickness of magnet 24 is also chosen so that the radial magnetic potential drop between surfaces 11 and 30 at end 15 is equal to the magnetic potential rise between intermediate circumferential portion or locus 32 and end 15. This will result in the magnetic potential between surfaces 30 and 11 at end 15 being equal and opposite to the magnetic potential between end 15 and intermediate circumferential portion or locus 32. The same analysis can be applied to any point on surface 11 between intermediate circumferential portion or locus 32 and end 15. The magnetic potential rise between point D at intermediate circumferential portion or locus 32 and any point G on surface 11 extending in a direction toward end 15 will be equal to the radial magnetic potential drop between point G and point H, where point H is the point at which a perpendicular extending radially from surface 11 at point G intersects surface 30.

This will result in a constant magnetic potential along surface 30 on magnet 24 equal to the magnetic potential existing at intermediate circumferential portion or locus 32. The magnetic potential along surface 30 on magnets 20 and 24 will now be a constant. This results in reduced magnetic flux leakage from the magnetic circuit.

The present invention requires substantially less magnetic material than is required in the prior art device, while maintaining the same beneficial results. For example in FIG. 3 the savings of magnetic material can be approximated by comparing the cross sectional area of the present invention with that of the comparable prior art device.

In the prior art device of FIG. 1 let h equal the largest radial thickness, and L the length of cladding magnet 10. The cross sectional area of cladding magnet 10 is then equal to (hL)/2, the area for a triangle. For equivalent magnetic cladding using the present invention, as illustrated in FIG. 3, cladding magnets 24, and 20 have a cross sectional area equal to $$\frac{(h/2)(L/2)}{2} (2) = \frac{hL}{4}.$$

Therefore the magnetic cladding in the present invention is approximately ½ that of the prior art. This results in substantial savings of material, weight, size, and cost while providing equivalent magnetic cladding as that of the prior art devices.

Figure 4:
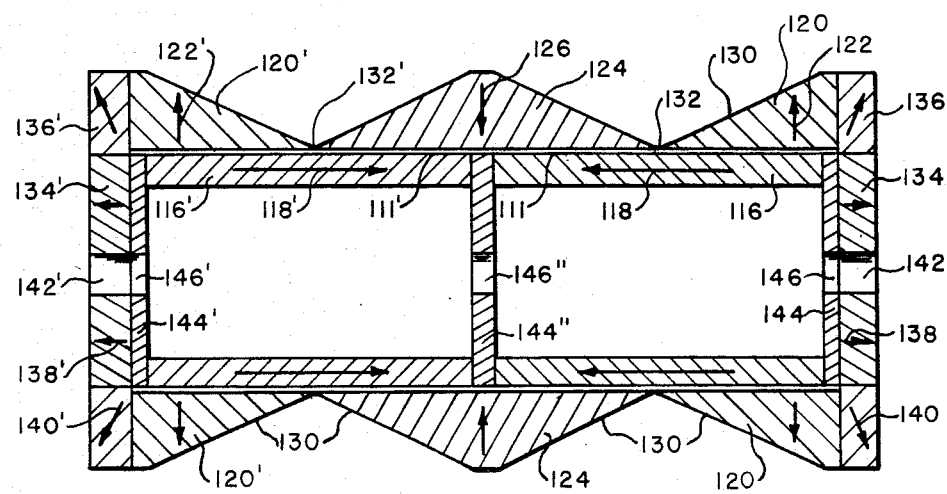
FIG. 4 is a longitudinal cross-section of a second embodiment of the invention.

FIG. 4 illustrates the invention as applied to a single-reversed magnetic circuit designed to produce fields for klystrons. Magnet 116 is a uniformly magnetized tubular magnet of constant radial thickness. Magnet 116 has an axial polarity indicated by arrow 118. Arrow 118 of magnet 116 points toward the north pole of magnet 116. Immediately adjacent the ends of magnet 116 are disc-shaped soft iron irises 144 and 144". One side of iris 144" is adjacent the north pole end of magnet 116. The other side of iris 144" is adjacent a second uniformly magnetized tubular magnet 116'. Magnet 116' is of constant radial thickness and mounted coaxially with magnet 116. Magnet 116' has an axial polarity as indicated by arrow 118'. Arrow 118' of magnet 116' point toward the north pole of magnet 116'. A third disc shaped soft iron iris 144' is adjacent the other outside end of magnet 116'. Magnet 120 is coaxially mounted circumscribing the length of magnet 116 and the circumference of iris 144. Magnet 120 has the shape of a truncated cone. The base or larger diameter of magnet 120 is positioned over the circumference and adjacent the end of soft iron iris 144. The radial thickness of magnet 120 doesn't vary over the width of iris 144. The truncated end or smaller diameter of magnet 120 extends longitudinally to intermediate circumferential portion or locus 132 between the ends of magnet 116. Magnet 120 is radially magnetized as indicated by arrows 122. Arrows 122 point radially away from magnet 116 toward the north pole of magnet 120. Magnet 124 is in the shape of a double truncated cone with adjoining bases or larger diameters. One conical portion of Magnet 124 coaxially circumscribes the remaining longitudinal portion of magnet 116 from intermediate circumferencial portion or locus 132 to iron iris 144". One truncated end of magnet 124 is positioned at intermediate circumferential portion or locus 132 and adjacent the truncated end of magnet 120. The second conical portion of magnet 124 coaxially circumscribes a longitudinal portion of magnet 116' from iron iris 144" to intermediate circumferential portion or locus 132'. The truncated end of the second conical portion of magnet 124 is positioned at intermediate circumferential portion or locus 132' on magnet 116'. Magnet 124 is uniformly magnetized and has a radial polarity represented by arrows 126. Arrows 126 point in the direction of the north pole of magnet 124. The portion of magnet 124 over iris 144" has a constant radial thickness. Magnet 120' coaxially circumscribes the remaining portion of magnet 116' from intermediate circumferential or locus 132' to the end thereof. Magnet 120' also circumscribes iris 144'. Magnet 120' is of truncated conical shape over magnet 116' and of constant radial thickness over iris 144'. The base or larger outer diameter of magnet 120' circumscribes the circumference of, and is positioned adjacent the end of iris 144'. The truncated end or smaller outer diameter of magnet 120' is adjacent the truncated end or smaller outer diameter of magnet 124 at intermediate circumferential portion or locus 132'. Magnet 120 is uniformly magnetized and has a radial polarity normal to the polarity of magnet 116. The polarity of magnet 120' is represented by arrow 122'. Arrow 122' points radially outward from magnet 116'. Arrow 122' also points toward the north pole of magnet 120'. A uniformly magnetized disc-shaped end magnet 134' is placed coaxially adjacent the outer surface of iris 144'. Both end magnet 134' and iris 144' have a central aperture 142' and 146' respectively. End magnet 134' is uniformly magnetized and has an axial polarity represented by arrow 138'. Arrow 138' points away from iris 144' and toward the north pole of end magnet 134'. Another end magnet 134 is placed coaxially adjacent the outer surface of iris 144. Both end magnet 134 and iris 144 have a central aperture 142 and 146 respectively. End magnet 134 is uniformly magnetized and has an axial polarity represented by arrow 138. Arrow 138 points away from iris 144 and toward the north pole of end magnet 134. If additional mangetic cladding is desired ring shaped corner or edge magnets 136 and 136' can be placed at the intersection of magnets 120, 120' and 134, 134' respectively. Edge magnets 136 and 136' have an oblique polarity represented by arrows 140, and 140'. Arrows 140, and 140' points toward the north pole of magnets 136, and 136' respectively. For further magnetic cladding, and to protect the interior portion of magnets 116 and 116' from the effects of stray external magnetic fields a thin soft iron coating may be placed around the periphery of the assembly leaving an aperture at either end corresponding to apertures 142 and 142'.

The operation of the embodiment in FIG. 4 is analogous to the operation of the embodiment as described for FIG. 3. In FIG. 4 magnets 116 and 116' create a magnetic field within their central bore. The magnetic field is used to contain an electron beam passing through apertures 142, 146, 146", 146', and 142'. The cladding magnets 120, 124, 120', 134, 134', 136 and 136' act to clad, counter or buck the exterior magnetic field generated by magnets 116 and 116' as well as assist in enhancing the magnetic field within the central bore of magnets 116 and 116'.

Magnet 116 has an increasing magnetic potential on surface 111 from the end adjacent iris 144 to the end adjacent iris 144". The potential increases linearly because magnet 116 is uniformly magnetized. The radial magnetic potential of magnet 120 between surface 130 and surface 111, complements or adds to the axial magnetic potential of magnet 116, between the end adjacent iris 144 and the location adjacent surface 111 from which the radial potential is taken. This creates a constant magnetic potential surface on the outer surface 130 of magnet 120. The constant magnetic potential surface 130 is made equal to the magnetic potential between intermediate circumferential portion or locus 132 and the end of magnet 116' adjacent iris 144. This is accomplished by selecting a maximum radial thickness of magnet 120 so as to obtain a radial potential equal to the axial potential of magnet 116 between the end adjacent iris 144 and intermediate circumference portion or locus 132.

Magnet 134, placed adjacent iris 144, increases the magnetic potential of the outer surface of the end of the device to the value of the potential existing on the surface 130 of magnets 120 and 124. This will prevent magnetic flux leakage from the end of the device. If the iris 144 is at a higher magnetic potential than surface 130, magnet 134 will be used to decrease the magnetic potential on the outer surface of the device to the value of the potential existing on the surface 130. This will be the case if all the magnetic polarities are reversed. In either situation magnet 134 will counter, either increase or decrease, the magnetic potential of the outer surface of the end of the device to a value of the potential existing on the surface 130.

If magnetic material of identical magnetic properties is used, magnet 134 will have an axial thickness equal to the radial thickness of magnet 120 at the end of the device adjacent magnet 134. Magnet 136 is positioned at the intersection of magnets 120 and 134. Magnet 136 prevents magnetic flux leakage due to the varying potential on the intersecting surfaces of magnets 120 and 134.

The soft iron irises 144, 144' and 144" act as magnetic conductors to aid in providing a more uniform magnetic field within the coaxial mounted tubes 116 and 116'. The irises 144, 144' and 144" being magnetic conductors are of equal magnetic potential along their respective axial extent. Therefore no increase or decrease in longitudinal magnetic potential exists on the axial extent of irises 144, 144', and 144". This is evident by the constant radial thickness of magnets 120, 124, and 120' existing over the magnetic irises 144, 144', and 144", respectfully.

The device in FIG. 4 is symmetrical about a lateral axis through the center of iris 144". The analysis of the operation of the device to the left of the center of iris 144" therefore is identical to the operation of the device to the right of the center of iris 144", as just described.

Figure 5:
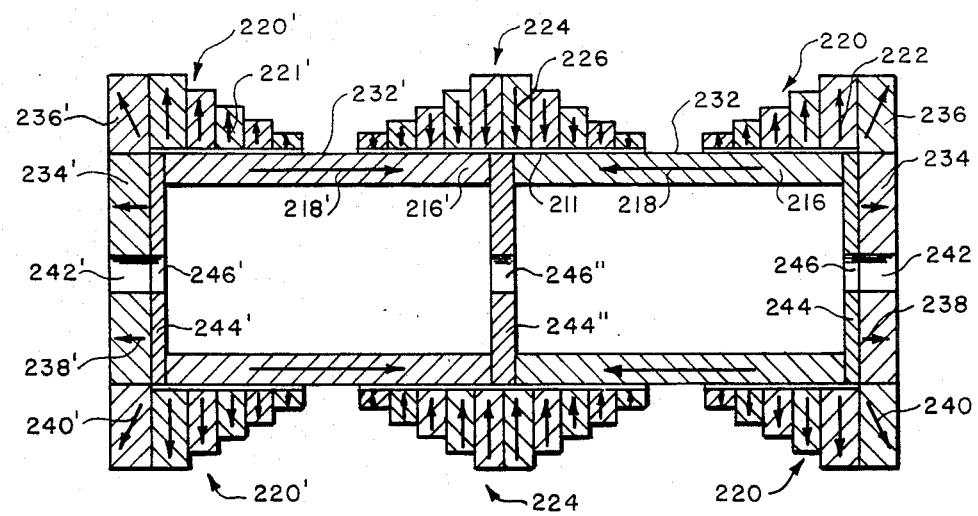
FIG. 5 is a longitudinal cross-section of a modified version of the second embodiment in FIG. 4 similar to the view shown in FIG. 1.

FIG. 5 illustrates a variation of the embodiment as illustrated in FIG. 4. Cylindrical tubular magnet 216 is uniformly magnetized and of constant radial thickness. Magnet 216 has an axial polarity in a direction indicated by arrows 218. Arrows 218 point toward the north pole of magnet 216. Adjacent each end of magnet 216 is a soft iron iris 244 and 244". Irises 244 and 244" both have a central aperture, 246, 246" respectively. Magnetic ring assembly 220 circumscribes the portion extent of the lower potential end of magnet 216 from intermediate circumferential portion or locus 232 to the end of magnet 216 over and adjacent iris 244. Magnetic ring assembly 220 is comprised of a plurality of radially magnetized coaxial rings of varying radial thicknesses. The individual magnetic rings are assembled on magnet 216 so as to approximate the linear slope of magnet 120 along surface 130 in FIG. 4. Magnetic ring assembly 220 extends to intermediate circumference portion or locus 232. All of the magnetic rings in magnetic ring assembly 220 are radially magnetized and have a polarity in the direction indicated by arrows 222. Each arrow 222 points toward the north pole of its respective magnetic ring. A portion of magnetic ring assembly 224 circumscribes the higher potential end of magnet 216 from intermediate circumferencial portion or locus 232 to the end of magnet 216 adjacent iris 244". Magnetic ring assembly 224 is comprised of a plurality of radially magnetized coaxial rings of varying radial thicknesses.

The individual magnetic rings circumscribing magnet 116 are arranged so as to approximate the linear slope of the portion of magnet 124 circumscribing magnet 116 along surface 130 in FIG. 4. All of the magnetic rings in magnetic ring assembly 224 are radially magnetized and have a polarity in the direction indicated by arrows 226. Each arrow 226 points toward the north pole of its respective magnetic ring in magnetic ring assembly 224.

Cylindrical tubular magnet 216' is mounted coaxially and adjacent to magnet 216. Iris 244" is coaxially positioned between magnets 216' and 216. Magnet 216' is uniformly magnetized and of constant radial thickness. Magnet 216' has an axial polarity in a direction indicated by arrows 218'. Arrows 218' point toward the north pole of magnet 216'. Soft iron iris 244' is coaxially positioned adjacent the end of magnet 216', opposite to the end adjacent iris 244". The remaining portion of magnetic ring assembly 224 circumscribes the higher potential end of magnet 216' from intermediate circumferential portion or locus 232' to the end of magnet 216' adjacent iris 244". The individual magnetic rings comprising magnetic ring assembly 224, circumscribing magnet 116', are arranged so as to approximate the linear slope of the portion of magnet 124 circumscribing magnet 116' along surface 130 in FIG. 4. Magnetic ring assembly 220' circumscribes the lower potential end of magnet 116' from intermediate circumferential portion or locus 232' to the end of magnet 216' adjacent iris 244'. Magnetic ring assembly 220' is comprised of a plurality of radially magnetized coaxial rings of varying radial thicknesses. The individual magnetic rings are assembled on magnet 216' so as to approximate the linear slope of magnet 120' along surface 130 in FIG. 4. The magnetic rings in magnetic ring assembly 220' are radially magnetized and have a polarity in the direction indicated by arrows 222'. Each arrow 222' points toward the north pole of its respective magnetic ring.

A disc-shaped end magnet 234' is placed coaxially adjacent the outer surface of iris 244. Both end magnet 234' and iris 244' have a central aperture 242' and 246' respectively. End magnet 234' is uniformly magnetized and has an axial polarity represented by arrows 238'. Arrows 238' point away from iris 244' and toward the north pole of end magnet 234'. Another end magnet 234 is placed coaxially adjacent the outer surface of iris 244. Both end magnet 234 and iris 244 have a central aperture 142 and 146 respectively. End magnet 234 is uniformly magnetized and has an axial polarity represented by arrows 238. Arrows 238 point away from iris 244 and toward the north pole of end magnet 234. If additional magnetic cladding is desired ring shaped corner or edge magnets 236 and 236' can be placed at the intersection magnet 220, 220' and 234, 234', respectively. Edge magnets 236 and 236' have an oblique polarity represented by arrows 240 and 240' respectively. Arrows 240 and 240' point toward the north pole of magnets 236 and 236' respectively. If desired for further magnetic cladding, and to protect the interior portion of magnets 216 and 216' from the effects of stray external magnetic fields a thin soft iron coating may be placed around the periphery of the assembly leaving an aperture at either end corresponding to apertures 242 and 242'.

The operation of the embodiment of FIG. 5 is identical to that of the embodiment of FIG. 4. The only difference in the embodiment of FIG. 5 from the embodiment of FIG. 4 is the substitution of magnetic ring assemblies 220, 224, and 220' for the magnets 120, 124, and 120' in FIG. 4. The magnet ring assemblies 220, 224, and 220' add and subtract to the magnetic potential on surfaces 211 and 211' of magnets 216 and 216' respectively in the same way as magnets 120, 124, and 120' add and subtract to the magnetic potential on surfaces 111, and 111' of magnets 116 and 116' respectively. The magnet ring assemblies 220, 224 and 220, in FIG. 5 permit easier manufacture than magnets 120, 124 and 120' in FIG. 4.

It shall be understood that the embodiments depicted can be combined in different configurations, and that numerous modifications or alterations may be made therein without departing from the spirit and scope of the invention as set forth in the appended claims.

What is claimed is:

1. A magnetic construction having low magnetic leakage comprising in combination:
   a longitudinally extending first magnet having a longitudinal magnetic polarity;
   a second magnet surrounding a substantial portion of the length of said first magnet, and having a generally radial magnetic polarity transverse to the longitudinal magnetic polarity of said first magnet,
   said second magnet having a constant magnetic potential on its outer exterior surface equal to the magnetic potential on the outer surface of said first magnet at a circumferential portion between the ends thereof.

2. A magnetic construction as in claim 1 wherein, said circumferential portion is located substantially at a magnetic midpoint of said first magnet.

3. A magnetic construction as in claim 1 wherein, said first magnet is uniformly magnetized along its longitudinal magnetic polarity, and said circumferencial portion is located substantially half way between the ends of said first magnet.

4. A magnetic construction as in claim 1 wherein, said second magnet is of double truncated conical shape having juxtaposed truncated ends.

5. A magnetic construction as in claim 1 wherein, said second magnet comprises a plurality of ring shaped magnets of varying radial thicknesses.

6. A magnetic construction as in claim 1 further comprising:
   means juxtaposed each end of said first magnet, for countering the magnetic potential at each said end.

7. A magnetic construction as in claim 6 wherein, said countering means comprises a first disc-shaped end magnet having an apperature therein and a generally axial polarity juxtaposed one end of said first magnet and a second disc-shaped end magnet having an apperature therein and a generally axial polarity juxtaposed the other end thereof.

8. A magnetic construction as in claim 7 further comprising:
   a first ring shaped edge magnet having a generally oblique polarity with respect to the axial polarity of said first disc shaped end magnet and positioned at the intersection of said first disc-shaped and magnet and said second magnet; and
   a second ring shaped edge magnet having a generally oblique polarity with respect to the axial polarity of said second ring shaped edge magnet, and positioned at the intersection of said second disc-shaped end magnet and said second magnet.

9. A magnetic construction having low magnetic leakage comprising:
   a first magnet having longitudinal magnetic polarity;
   a second magnet surrounding a first portion of said first magnet and extending longitudinally from a first end thereof to an intermediate circumferencial portion thereof and having a polarity transverse to the longitudinal magnetic polarity of said first magnet,
   the transverse magnetic potential difference of said second magnet being a maximum at said first end and a minimum at said intermediate circumferencial portion;
   a third magnet surrounding another portion of said first magnet and extending longitudinally from said intermediate circumferencial portion thereof to a second end thereof, and having a polarity transverse to the longitudinal magnetic polarity of said first magnet and in a direction opposite to the polarity of said second magnet,
   the transverse magnetic potential difference of said third magnet being a maximum at said second end and a minimum at said intermediate circumferential portion,
   whereby the exterior surfaces of said second and third magnets are substantially of constant magnetic potential.

* * * * *